US010163674B2

United States Patent
Hara et al.

(10) Patent No.: US 10,163,674 B2
(45) Date of Patent: Dec. 25, 2018

(54) CIRCULAR SUPPORT SUBSTRATE FOR SEMICONDUCTOR

(71) Applicant: NATIONAL INSTITUTE OF ADVANCED INDUSTRIAL SCIENCE AND TECHNOLOGY, Chiyoda-ku, Tokyo (JP)

(72) Inventors: Shiro Hara, Tsukuba (JP); Sommawan Khumpuang, Tsukuba (JP); Fumito Imura, Tsukuba (JP); Michihiro Inoue, Tosu (JP); Arami Saruwatari, Tosu (JP)

(73) Assignee: NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 0 days.

(21) Appl. No.: 15/529,070

(22) PCT Filed: Nov. 24, 2015

(86) PCT No.: PCT/JP2015/082845
§ 371 (c)(1),
(2) Date: Aug. 9, 2017

(87) PCT Pub. No.: WO2016/084767
PCT Pub. Date: Jun. 2, 2016

(65) Prior Publication Data
US 2017/0352570 A1 Dec. 7, 2017

(30) Foreign Application Priority Data
Nov. 27, 2014 (JP) ................................ 2014-239966

(51) Int. Cl.
*H01L 23/544* (2006.01)
*H01L 21/683* (2006.01)
(Continued)

(52) U.S. Cl.
CPC .......... *H01L 21/6835* (2013.01); *H01L 21/02* (2013.01); *H01L 21/565* (2013.01);
(Continued)

(58) Field of Classification Search
CPC .......... H01L 21/68; H01L 2221/68309; H01L 23/3736; H01L 23/544; H01L 2223/54426;
(Continued)

(56) References Cited

U.S. PATENT DOCUMENTS 4,862,247 A * 8/1989 Derryberry ............. H01L 23/13
257/693
5,869,386 A * 2/1999 Hamajima ................ G03F 9/70
148/DIG. 102
(Continued)

FOREIGN PATENT DOCUMENTS

JP S60236251 A 11/1985
JP S62276519 A 12/1987
(Continued)

OTHER PUBLICATIONS

Machine translation of JP 2010-003973 A.*
(Continued)

*Primary Examiner* — Bryan R Junge
(74) *Attorney, Agent, or Firm* — Law Office of Katsuhiro Arai

(57) ABSTRACT

An object of the present invention is to provide a circular support substrate that allows for positioning based solely on its outer periphery shape. As a means for solving the problems, a circular support substrate is provided that has at least three chords along its circumference, wherein the chords are provided at positions where they do not run linearly symmetrical to the straight line passing through the center axis of the circular support substrate.

18 Claims, 6 Drawing Sheets

(51) Int. Cl.
*H01L 21/02* (2006.01)
*H01L 21/56* (2006.01)
*H01L 23/31* (2006.01)
*H01L 23/00* (2006.01)

(52) U.S. Cl.
CPC ........ *H01L 21/683* (2013.01); *H01L 23/3114* (2013.01); *H01L 23/544* (2013.01); *H01L 24/02* (2013.01); *H01L 21/568* (2013.01); *H01L 24/03* (2013.01); *H01L 24/05* (2013.01); *H01L 24/11* (2013.01); *H01L 24/13* (2013.01); *H01L 2221/68309* (2013.01); *H01L 2221/68372* (2013.01); *H01L 2223/54426* (2013.01); *H01L 2224/0239* (2013.01); *H01L 2224/02311* (2013.01); *H01L 2224/02313* (2013.01); *H01L 2224/02377* (2013.01); *H01L 2224/02379* (2013.01); *H01L 2224/03002* (2013.01); *H01L 2224/0361* (2013.01); *H01L 2224/0391* (2013.01); *H01L 2224/03462* (2013.01); *H01L 2224/03622* (2013.01); *H01L 2224/0401* (2013.01); *H01L 2224/05548* (2013.01); *H01L 2224/11002* (2013.01); *H01L 2224/11334* (2013.01); *H01L 2224/11849* (2013.01); *H01L 2224/12105* (2013.01); *H01L 2224/13022* (2013.01); *H01L 2224/13024* (2013.01); *H01L 2224/94* (2013.01); *H01L 2924/01029* (2013.01)

(58) Field of Classification Search
CPC ..................... H01L 24/94; H01L 24/96; H01L 2224/8012–2224/80141; H01L 2224/8312–2224/83141; H01L 25/0655; H01L 25/072; H01L 25/0753; H01L 21/187; H01L 21/2007; H01L 21/76251; H01L 23/12–23/15; H01L 2224/94
See application file for complete search history.

(56) References Cited

U.S. PATENT DOCUMENTS

| | | | | |
|---|---|---|---|---|
| 2004/0246795 | A1* | 12/2004 | Tomita | H01L 21/76251 365/200 |
| 2006/0255341 | A1* | 11/2006 | Pinnington | B82Y 20/00 257/79 |
| 2007/0085170 | A1* | 4/2007 | Shin | C30B 25/02 257/627 |
| 2010/0044857 | A1* | 2/2010 | Shao | H01L 21/561 257/723 |
| 2010/0127386 | A1* | 5/2010 | Meyer-Berg | H01L 21/565 257/698 |
| 2010/0249986 | A1* | 9/2010 | Arai | G01D 5/342 700/213 |
| 2011/0018116 | A1* | 1/2011 | Feng | H01L 29/0657 257/690 |
| 2011/0272800 | A1* | 11/2011 | Chino | H01L 21/561 257/737 |
| 2015/0102707 | A1 | 4/2015 | Hori et al. | |

FOREIGN PATENT DOCUMENTS

| | | |
|---|---|---|
| JP | H04014811 | 1/1992 |
| JP | H0562980 A | 3/1993 |
| JP | H07110455 B2 | 11/1995 |
| JP | 2660559 B2 | 10/1997 |
| JP | 2001223425 A | 8/2001 |
| JP | 2002124444 A | 4/2002 |
| JP | 2002184845 A | 6/2002 |
| JP | 2004356411 A * | 12/2004 |
| JP | 2004356414 A * | 12/2004 |
| JP | 2005183689 A | 7/2005 |
| JP | 2010003973 A | 1/2010 |
| JP | 2011238767 A | 11/2011 |
| WO | 2013187410 A1 | 12/2013 |

OTHER PUBLICATIONS

Notification of Transmittal of Translation of the International Preliminary Report on Patentability (PCT/IB/338) dated Jun. 8, 2017, with International Preliminary Report on Patentability (PCT/IB/373) and Written Opinion of the International Searching Authority (PCT/ISA/237), for corresponding international application PCT/JP2015/082845.

International Search Report (ISR) dated Feb. 9, 2016, issued for International application No. PCT/JP2015/082845.

A Notification of Reasons for Refusal issued by the Japanese Patent Office, dated Sep. 4, 2018, for Japanese counterpart application No. 2016-561571.

* cited by examiner

[FIG. 1]
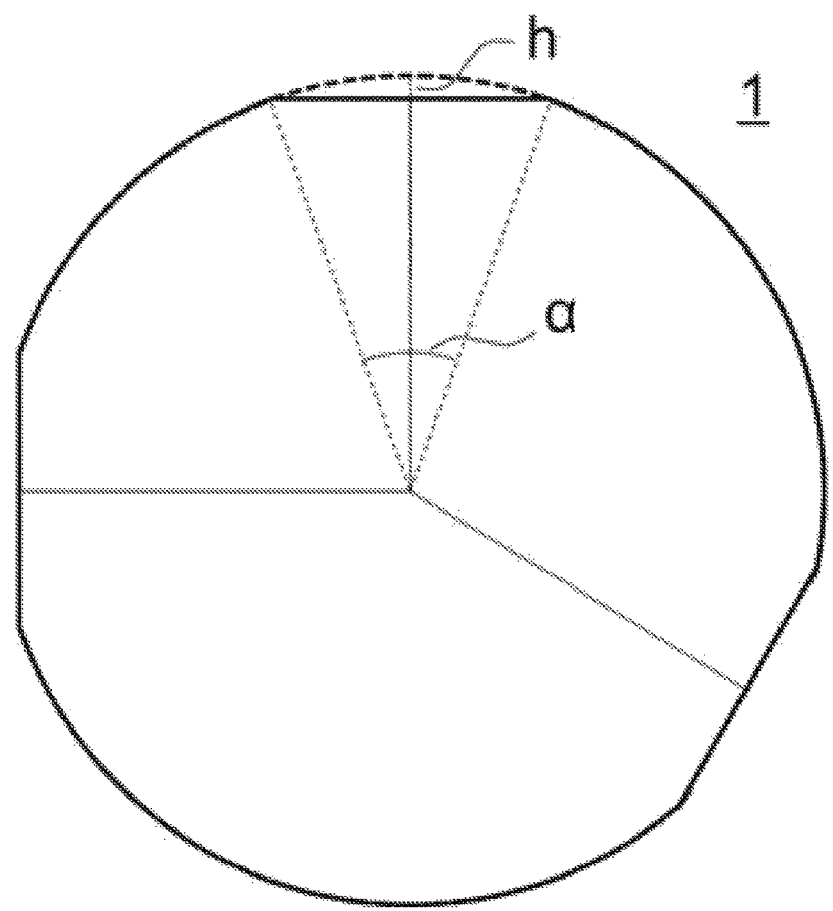

[FIG. 2]
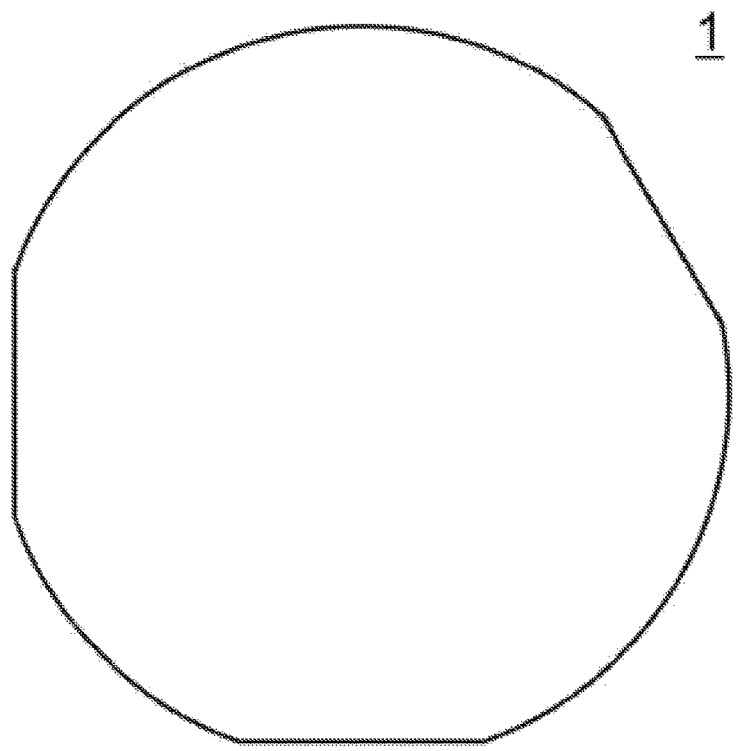
[FIG. 3]
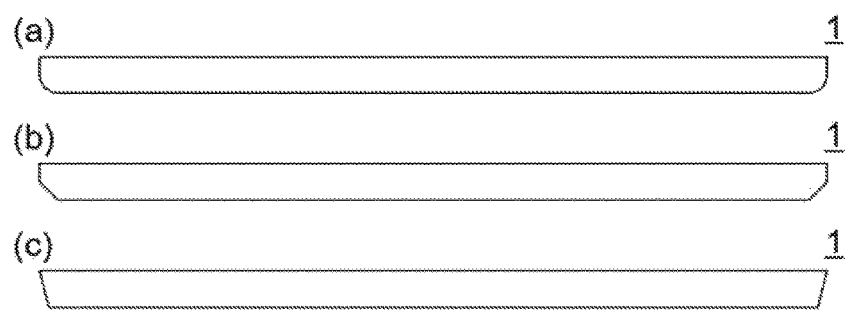

[FIG. 4]
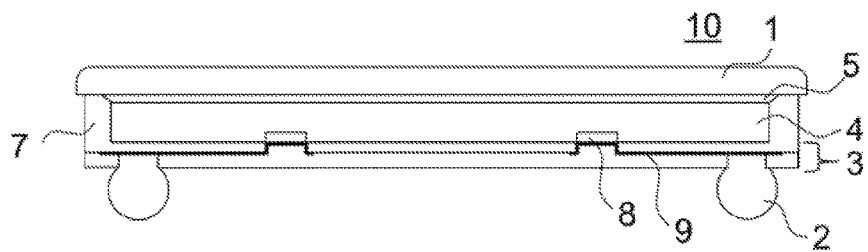
[FIG. 5]
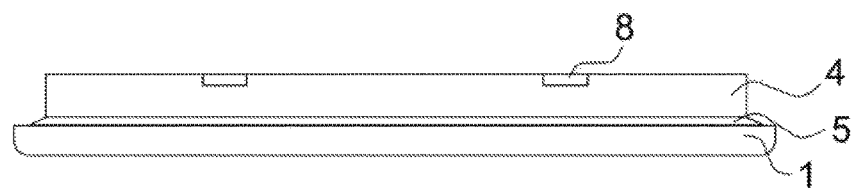
[FIG. 6]
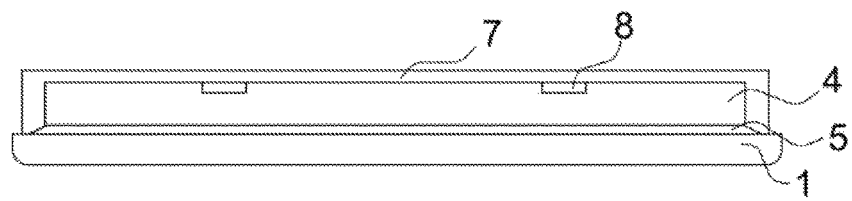
[FIG. 7]
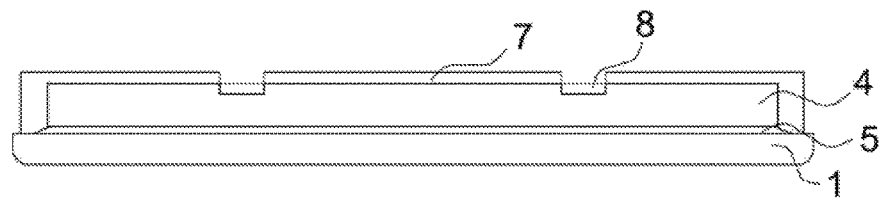

[FIG. 8]
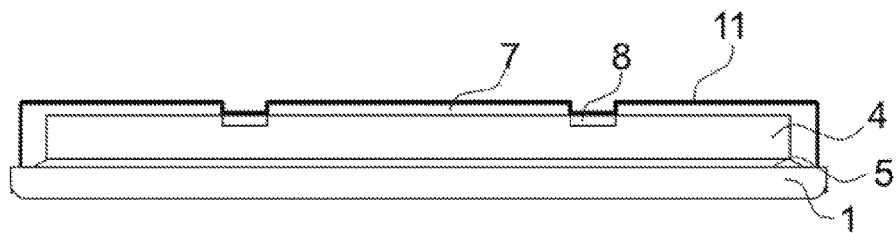
[FIG. 9]
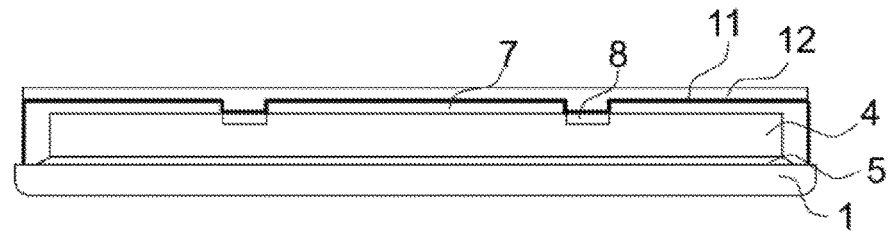
[FIG. 10]
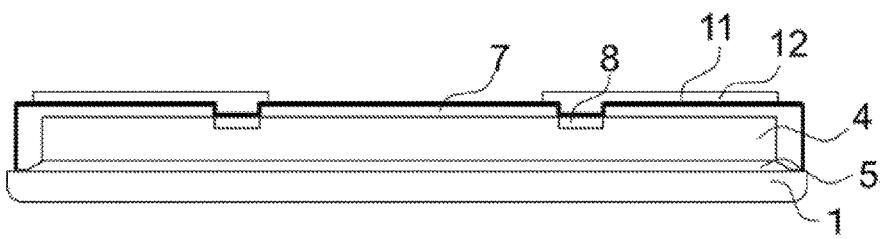
[FIG. 11]
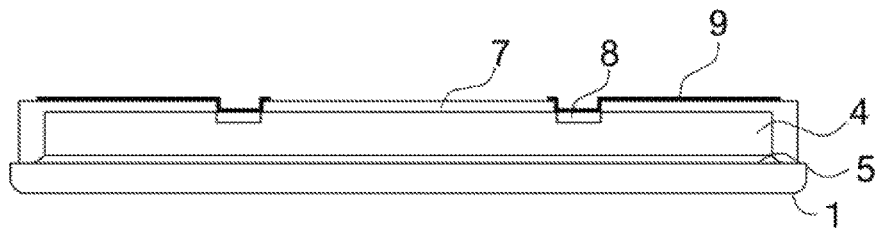

[FIG. 12]
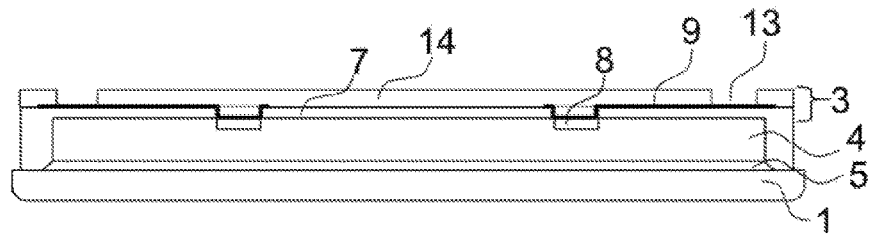
[FIG. 13]
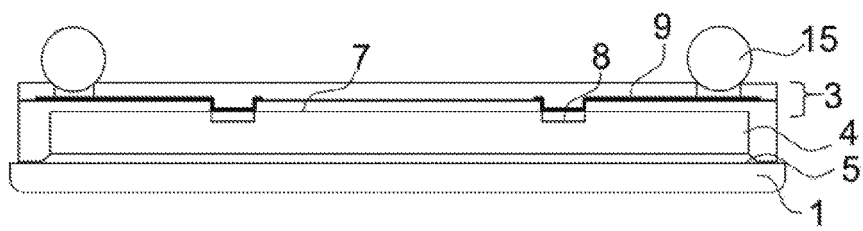
[FIG. 14]
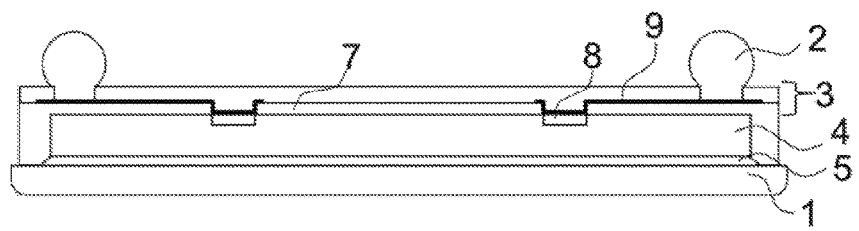
[FIG. 15]
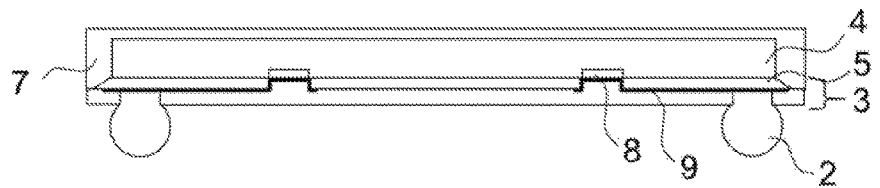

[FIG. 16]
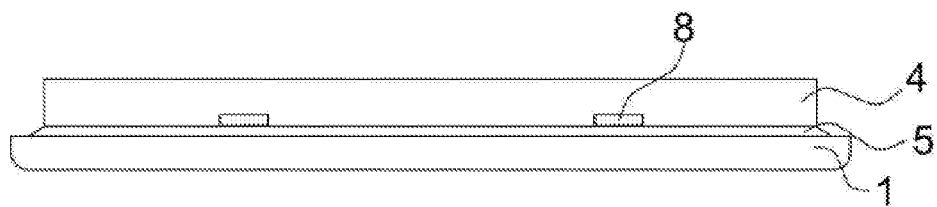
[FIG. 17]
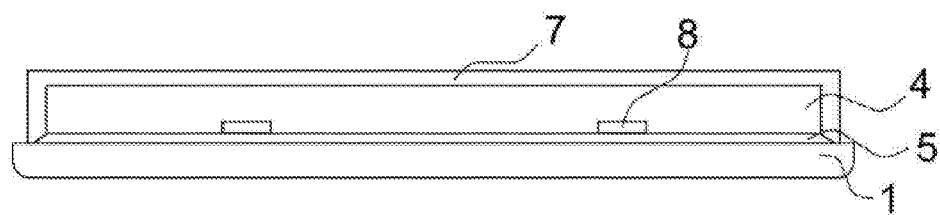
[FIG. 18]
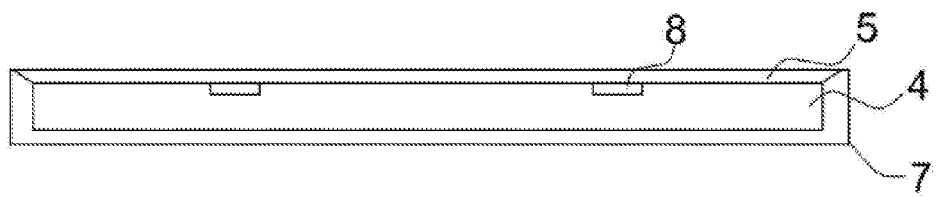

CIRCULAR SUPPORT SUBSTRATE FOR SEMICONDUCTOR

This application is the U.S. National Phase under 35 U.S.C. § 371 of International Application PCT/JP2015/082845, filed Nov. 24, 2015, which claims priority to Japanese Patent Application No. 2014-239966, filed Nov. 27, 2014. The International Application was published under PCT Article 21(2) in a language other than English.

TECHNICAL FIELD

The present invention relates to a circular support substrate to be bonded to a wafer when manufacturing a semiconductor package.

BACKGROUND ART

Semiconductor package manufacturing processes may involve bonding of circular support substrates to wafers. Patent Literature 1 proposes a support substrate made of sapphire, on which indication parts (notches) are formed for positioning. Practices of providing marking-off lines, depressions, projections, and other marks, besides notches, are known, where these marks are provided along the periphery of the support substrate and the wafer is attached in a manner not concealing the marks on the support substrate. The marks must be large enough to be detected in a reliable manner, and since the support substrate becomes larger than the wafer as a result, each process apparatus in the manufacturing process must be made larger.

Also, Patent Literature 2 proposes providing an optical detection film on the side of a support substrate opposite the side to be bonded with a processing substrate, where such film has markedly different optical characteristics, such as reflectance and optical transmission factor, than those of the support substrate, and detecting this optical detection film with an optical sensor to perform positioning. This support substrate can be sized roughly identical to the wafer; however, it requires an extra step to form the optical detection film, and it is also necessary to incorporate into the process apparatus an optical system capable of measuring the reflectance and the transmission factor.

BACKGROUND ART LITERATURE

Patent Literature

Patent Literature 1: Japanese Patent Laid-open No. 2002-184845
Patent Literature 2: Japanese Patent Laid-open No. 2005-183689

SUMMARY OF THE INVENTION

Problems to be Solved by the Invention

An object of the present invention is to provide a circular support substrate that allows for positioning based solely on its outer periphery shape.

Means for Solving the Problems

1. A circular support substrate having at least three chords along its circumference, characterized in that the chords are provided at positions where they do not run linearly symmetrical to a straight line passing through the center axis of the circular support substrate.
2. A circular support substrate according to 1, characterized in that the angle formed by both ends of each of the chords and the center axis of the circular support substrate is 12 to 36 degrees.
3. A circular support substrate according to 1 or 2, characterized in that the angle formed by two of respective lines, perpendicular to the at least three chords, drawn from the center axis of the circular support substrate, is 90 degrees or 180 degrees.
4. A circular support substrate according to any one of 1 to 3, characterized in that the circular support substrate has three chords, and the angles formed by three lines, perpendicular to the three chords, drawn from the center axis of the circular support substrate are 90 degrees, 120 degrees, and 150 degrees, respectively.
5. A circular support substrate according to any one of 1 to 4, characterized in that the circular support substrate is made of 42 alloy, Invar alloy, or Kovar alloy.
6. A circular support substrate according to any one of 1 to 5, characterized in that its physical properties are different on one face and the other face.
7. A circular support substrate according to any one of 1 to 6, characterized in that one face of the support substrate is chamfered, but the other face is not chamfered.
8. A semiconductor package characterized in that it comprises at least:
   a circular support substrate according to any one of 1 to 7;
   a semiconductor chip bonded to the circular support substrate;
   a sealing resin part that seals the semiconductor chip; and
   external electrodes that are electrically connected, via conductive parts, to pads on the semiconductor chip.
9. A semiconductor package according to 8, characterized in that the external electrodes are bumps.
10. A method for manufacturing a semiconductor package, characterized in that it comprises a step to bond a wafer to a circular support substrate according to any one of 1 to 7.
11. A method for manufacturing a semiconductor package, characterized in that it comprises at least the following steps in this order:
   a first step in which a semiconductor chip is bonded onto a circular support substrate according to any one of 1 to 7, in such a way that the pads face up;
   a second step in which the semiconductor chip is sealed with resin;
   a third step in which the resin covering the pads of the semiconductor chip is removed;
   a fourth step in which a rewiring layer is formed; and
   a fifth step in which bumps are formed.
12. A method for manufacturing a semiconductor package, characterized in that it comprises at least the following steps in this order:
   a first step in which a semiconductor chip is bonded onto a circular support substrate according to any one of 1 to 7, in such a way that the pads face down;
   a second step in which the semiconductor chip is sealed with resin;
   a third step in which the circular support substrate is separated and turned upside down so that the pads face up;
   a fourth step in which a rewiring layer is formed; and
   a fifth step in which bumps are formed.

Effects of the Invention

The circular support substrate proposed by the present invention has at least three chords placed along its circumference in a manner not running linearly symmetrical to the straight line passing through the center axis of the circular support substrate, and therefore it allows for positioning using the positional relationship of the chords. Since it allows for positioning based on its outer periphery shape, the circular support substrate needs to be only slightly larger than the wafer. Since the wafer that has been bonded to the circular support substrate can be processed at dimensions roughly the same as the size of the wafer, each process apparatus used in the semiconductor package manufacturing process can be made smaller.

By placing the circular support substrate in such a way that the angle formed by two lines among the respective lines perpendicular to at least three chords, drawn from the center axis, becomes either 90 degrees or 180 degrees, these chords can be used to perform positioning in the X direction and the Y direction. Furthermore, when the angles formed by the three lines perpendicular to the three chords, drawn from the center axis of the circular support substrate, respectively, are 90 degrees, 120 degrees, and 150 degrees, more precise positioning is possible based not only on the X direction and Y direction, but also on the inclination ($\theta$).

The circular support substrate proposed by the present invention need not be separated after having been used in the manufacturing process; instead, it may be incorporated into the semiconductor package. By forming the circular support substrate using 42 alloy, Invar alloy, or Kovar alloy, whose thermal expansion coefficient is close to those of the ceramic materials from which semiconductor chips are formed, their separation at the interface can be prevented.

In addition, the circular support substrate proposed by the present invention is not linearly symmetrical, and this allows one face and the other face of it to be distinguished based on the positional relationship of the chords. As a result, the present invention can be used favorably for a circular support substrate whose physical properties are different on one face and the other face.

BRIEF DESCRIPTION OF THE DRAWINGS

[FIG. 1] Plan view of a circular support substrate according to the present invention.
[FIG. 2] Bottom view of a circular support substrate according to the present invention.
[FIG. 3] Cross sectional view of a circular support substrates which are chamfered on one face, but not chamfered on the other face.
[FIG. 4] Cross sectional view of an embodiment of a semiconductor package having a circular support substrate according to the present invention.
[FIG. 5] Cross sectional view of a method for manufacturing a semiconductor package.
[FIG. 6] Cross sectional view of a method for manufacturing a semiconductor package.
[FIG. 7] Cross sectional view of a method for manufacturing a semiconductor package.
[FIG. 8] Cross sectional view of a method for manufacturing a semiconductor package.
[FIG. 9] Cross sectional view of a method for manufacturing a semiconductor package.
[FIG. 10] Cross sectional view of a method for manufacturing a semiconductor package.
[FIG. 11] Cross sectional view of a method for manufacturing a semiconductor package.
[FIG. 12] Cross sectional view of a method for manufacturing a semiconductor package.
[FIG. 13] Cross sectional view of a method for manufacturing a semiconductor package.
[FIG. 14] Cross sectional view of a method for manufacturing a semiconductor package.
[FIG. 15] Cross sectional view of an embodiment of a semiconductor package that has been manufactured based on a manufacturing method comprising a step to separate a circular support substrate according to the present invention.
[FIG. 16] Cross sectional view of a method for manufacturing a semiconductor package.
[FIG. 17] Cross sectional view of a method for manufacturing a semiconductor package.
[FIG. 18] Cross sectional view of a method for manufacturing a semiconductor package.

DESCRIPTION OF THE SYMBOLS

1 Circular support substrate
2 External electrode
3 Rewiring layer
4 Semiconductor chip
5 Adhesive
6 Support substrate
7 Sealing resin part
8 Pad
9 Conductive part
10 Semiconductor package
11 Copper layer
12 Resist layer
13 Via hole
14 Solder resist
15 Solder ball

MODE FOR CARRYING OUT THE INVENTION

The present invention relates to a circular support substrate to be bonded to a wafer when manufacturing a semiconductor package. The circular support substrate proposed by the present invention is characterized in that at least three chords are provided along its circumference, at positions where they do not run linearly symmetrical to the straight line passing through the center axis of the circular support substrate.

A plan view of an embodiment of a circular support substrate according to the present invention is shown in FIG. 1. The circular support substrate 1 according to the present invention has at least three chords placed along its circumference, at positions where they do not run linearly symmetrical to the straight line passing through the center axis of the circular support substrate, and therefore it allows for positioning based solely on its outer periphery shape, or specifically the positional relationship of the chords. The number of chords is not limited in any way, so long as it is three or greater; however, most preferably there are three chords because more chords mean more segments along the circumference are occupied by the chords, which in turn makes it difficult to discriminate the positional relationship of the chords.

Preferably the angle (center angle) formed by both ends of each chord and the center axis of the circular support substrate is 12 to 36 degrees. It should be noted that the center angle represents the angle denoted by $\alpha$ in FIG. 1. More preferably the center angle is 16 to 32 degrees, and most preferably 20 to 28 degrees. If the center angle is smaller than 12 degrees, the chord becomes too short and checking the position of the chord becomes difficult. If the center angle is greater than 36 degrees, the camber becomes too high and the size of a wafer that can be bonded without protruding from the circular support substrate decreases. It should be noted that the camber refers to the longest distance between the circumference and the chord, and is denoted by h in FIG. 1. With the circular support substrate proposed by the present invention, the center angle relative to each chord, or specifically the length of each chord, may be the same or different. For example, the length of one chord can be made different from the lengths of the other chords, as this makes it easy to grasp the position relationship of the other chords using the chord of the different length.

Preferably the angle formed by two lines among the lines perpendicular to at least three chords, drawn from the center axis of the circular support substrate, respectively, is either 90 degrees or 180 degrees. By placing the chords this way, at least the X direction or Y direction, or both, can be defined using the two chords whose perpendicular lines form an angle of 90 degrees or 180 degrees, which in turn makes positioning on the manufacturing apparatus easy.

More preferably the circular support substrate has three chords and the angles formed by the three perpendicular lines drawn from the center axis to these three chords are 90 degrees, 120 degrees and 150 degrees, respectively. By placing the chords this way, not only the X direction and Y direction, but also the inclination (θ), can be defined using the three chords, which in turn allows for more precise positioning. It should be noted that the three perpendicular lines on the circular support substrate shown in FIG. 1 form angles of 90 degrees, 120 degrees and 150 degrees, respectively.

The material from which to form the circular support substrate proposed by the present invention is not limited in any way, and any material may be selected as deemed appropriate from copper, aluminum, stainless steel, iron, titanium, graphite, tantalum, zirconium, tungsten, molybdenum, 42 alloy, Invar alloy, Kovar alloy, glass, quartz, sapphire, glass epoxy, etc. Among these, copper or aluminum providing excellent thermal conductivity, or 42 alloy, Inver alloy, or Kovar alloy, whose thermal expansion coefficient is close to those of the ceramic materials from which semiconductor chips are formed, is preferred.

The method for forming chords on the circular support substrate proposed by the present invention is not limited in any way, and they may be formed by cutting, grinding, or otherwise machining the side face of a disk-shaped support substrate, or by directly stamping out of a metal sheet a disk shape having at least three chords.

FIG. 2 shows a bottom view of the circular support substrate shown in FIG. 1. The circular support substrate proposed by the present invention has at least three chords placed at positions where they do not run linearly symmetrical to the straight line passing through the center axis of the circular support substrate. Because the circular support substrate proposed by the present invention is not linearly symmetrical, the plan view shown in FIG. 1 does not perfectly overlap with the bottom view shown in FIG. 2. In other words, the circular support substrate proposed by the present invention allows one face and the other face of it to be discriminated based solely on its outer periphery shape. As a result, the circular support substrate proposed by the present invention can be used favorably for a circular support substrate whose physical properties are different on one face and the other face. Such support substrate can be obtained by treating one face and the other face in different ways, or by treating only one face. The types of treatments to be given to the circular support substrate are not limited in any way, and examples include hydrophilic treatment, water-repellent treatment, removal facilitation treatment, smoothing treatment, roughening treatment, plating treatment, thin film forming treatment, and chamfering treatment, etc. It should be noted that, when the circular support substrate has one or two chords, it is linearly symmetrical and therefore one face and the other face of it cannot be discriminated based on its outer periphery shape alone.

The circular support substrate proposed by the present invention is used with a wafer bonded to it, as necessary, in the pre-processing and post-processing of the semiconductor package manufacturing process without any limitation. The bonded circular support substrate may be separated from the wafer, or it may be incorporated into the semiconductor package without being separated from the wafer, as necessary. The ceramic material from which to form the wafer to be bonded to the circular support substrate is not limited in any way, and silicon, germanium, gallium arsenide, gallium arsenide phosphide, silicon carbide, gallium nitride, sapphire, diamond, etc., may be used.

With circular support substrates according to prior art, marking-off lines, notches, depressions, projections, or other marks are provided and these marks are used as the reference for positioning. In the case of a circular support substrate having such marks according to prior art, the circular support substrate must have a diameter larger than the wafer by 10 mm or more, or preferably 20 mm or more, so that the marks can be checked after the substrate has been bonded to the wafer. With the circular support substrate proposed by the present invention, on the other hand, positioning is possible using at least three chords positioned along its outer periphery, and therefore the space between the periphery of the wafer and the periphery of the circular support substrate can be narrow. The diameter of the circular support substrate needs only to be larger by 0.1 to 8.0 mm, and is preferably larger by 0.1 to 4.0 mm, or more preferably larger by 0.1 to 1.0 mm, than the wafer. By using the circular support substrate proposed by the present invention, the wafer that has been bonded to the circular support substrate can be processed at dimensions roughly the same as the size of the wafer, and each process apparatus used in the semiconductor package manufacturing process can be made smaller.

By using the circular support substrate proposed by the present invention, a wafer that has been bonded to the circular support substrate can be handled based on a diameter roughly the same as that of the wafer. Accordingly, the circular support substrate proposed by the present invention can be used favorably for a device manufacturing system that performs a specified process using a unit processing apparatus having a local cleaning device proposed by Japanese Patent Laid-open No. 2012-54414 or Japanese Patent Laid-open No. 2014-30034. It should be noted that, although Japanese Patent Laid-open No. 2012-54414 and Japanese Patent Laid-open No. 2014-30034 mentioned above each propose a circular wafer of 0.5 inches in diameter, the wafers used under the present invention are not limited to this wafer size.

The shape of wafers to be bonded to the circular support substrate proposed by the present invention is not limited to circle, and they may have a rectangular or polygonal shape. Also, the wafers may have many patterns based on which they can be diced later into semiconductor chips, or they may each represent a semiconductor chip on which a single device is formed. Since the circular support substrate proposed by the present invention is such that its outer periphery shape can be used to position the wafer that has been bonded to the circular support substrate, there is no need to form alignment marks on the wafer. As a result, the entire area of the wafer can be used for the manufacturing of semiconductor chip. The type of semiconductor chip is not limited in any way, and integrated circuits, large-scale integrated circuits, transistors, thyristors, diodes, solid state imaging elements, MEMS devices, etc., may be used, for example.

The following describes a circular support substrate in an embodiment of the present invention, which is chamfered only on one face.

FIG. 3 shows a cross sectional view of the circular support substrate which is chamfered on one face, but not chamfered on the other face. Chamfering can be performed to achieve a round face as shown in FIG. 3 (*a*), or angled face as shown in FIG. 3 (*b*) or (*c*). In FIGS. 3 (*a*) and (*b*), the angle formed by the non-chamfered face and the side face is 90 degrees. As shown in FIG. 3 (*c*), more chamfering causes the angle formed by the non-chamfered face and the side face to become 90 degrees or less; however, preferably this angle is 75 to 90 degrees. If this angle is smaller than 75 degrees, cracks and chipping occur easily because the angle is too acute. The circular support substrate is used for semiconductor package manufacturing, so it is not desirable that cracks or chipping occur as they could become sources of contamination.

The chamfering method is not limited in any way, and chamfering can be performed by cutting, grinding or otherwise machining the circular support substrate, or it may be performed using a chamfering die at the same time the circular support substrate is stamped out. If chamfering is performed using a chamfering die at the same time a support substrate having three chords is stamped out of a metal sheet, a circular support substrate which is chamfered only on one face can be manufactured efficiently.

FIG. 4 shows a cross sectional view of an embodiment of a semiconductor package having a circular support substrate which is chamfered only on one face. This semiconductor package 10 has external electrodes 2, a rewiring layer 3, a semiconductor chip 4, adhesive 5, and a circular support substrate 1, which are stacked in this order, and the chamfered face of the circular support substrate 1 is exposed on the surface of the semiconductor package 10. The face on the rewiring layer 3 side, and side faces, of the semiconductor chip 4, are sealed with a sealing resin part 7. Pads 8 on the semiconductor chip 4 are not covered with the sealing resin part 7, and the pads 8 are electrically connected to the external electrodes 2 via conductive parts 9 of the rewiring layer 3.

It should be noted that the semiconductor package shown in FIG. 4 is an example of a semiconductor package having a circular support substrate according to the present invention, and the semiconductor package having a circular support substrate is not limited to this structure. For example, the semiconductor chip 4 may be eutectically bonded to the circular support substrate 1, the circular support substrate 1 may be entirely sealed with the sealing resin part 7, the external electrodes 2 may be shaped like pads, and multiple semiconductor chips 4 may be arranged in parallel or stacked and sealed together. Also, the conductive parts 9 connecting the pads 8 and the external electrodes 2 may be formed by wire bonding, TAB (tape automated bonding), or flip-chip bonding, while the type of semiconductor package is not limited to a BGA (ball grid array) package and it may be a QFN (quad flat no-lead) package, or LGA (land grid array) package.

The applications of the semiconductor package in this embodiment are not limited in any way, but it offers excellent heat radiation performance because the circular support substrate is exposed on the surface of the semiconductor package. Accordingly, the semiconductor package is suited for CPUs (central processing units) and power semiconductors generating a large amount of heat, and in-vehicle applications requiring durability at high temperatures, etc.

The method for manufacturing the semiconductor package shown in FIG. 4 is explained below using FIGS. 5 to 14. (First Step in which a Semiconductor Chip is Bonded onto a Non-Chamfered Face of the Circular Support Substrate, in Such a Way that the Pads Face Up)

Onto a circular support substrate 1 made of 42 alloy whose diameter is 13.5 mm and thickness is 0.2 mm, a circular semiconductor chip 4 made of silicon whose diameter is 0.5 inches (12.5 mm) and thickness is 0.25 mm is bonded using adhesive 5, with the pads 8 facing up, and also in a manner concentric with the circular support substrate 1 (FIG. 5). Preferably the adhesive 5 is thermally conductive adhesive. Since the circular support substrate 1 according to the present invention allows its chamfered face to be discriminated based on its outer periphery shape, bonding of the semiconductor chip 4 onto a wrong face can be prevented. Also, the semiconductor chip 4 has a circular shape, which prevents the uncured adhesive spreading uniformly at the time of bonding from oozing out of the edges of the semiconductor chip.

The circular support substrate 1 has the shape shown in FIG. 1, and the angles formed by the three perpendicular lines drawn from the center axis to the chords are 90 degrees, 120 degrees and 150 degrees, respectively. The center angle of each chord is 24 degrees, and the camber is 0.15 mm. (Second Step in which the Semiconductor Chip is Sealed with Resin)

A die having a cylindrical concave of 12.8 mm in diameter and 0.4 mm in depth is pressed against the circular support substrate 1 to form a cavity. Thermosetting resin is poured into the cavity and cured into a mold, to form a sealing resin part 7 that seals the top face and side faces of the semiconductor chip 4 (FIG. 6). The resin to be used is not limited in any way, and any commercially available resin can be used without any limitations. Generally, for resins used to seal semiconductors, compositions whose primary component is epoxy resin and which also contain phenol resin hardener and silica filler or other inorganic filler are used; however, phenol resins, silicon resins, and the like, can also be used without any limitations.

Now, the diameter of the circular support substrate 1 is only 1 mm larger than the diameter of the semiconductor chip 4, so the gap between the semiconductor chip 4 and the circular support substrate 1 is 0.5 mm. In addition, the diameter of the die is 12.8 mm, so the gap between the semiconductor chip 4 and the die is 0.15 mm. Furthermore, the face of the circular support substrate 1 to which the semiconductor chip 4 is bonded is not chamfered, which means that the die contacts the circular support substrate 1 over a width of 0.35 mm within the gap of 0.5 mm between the semiconductor chip 4 and the circular support substrate 1. Moreover, since the camber is 0.15 mm, the narrowest width over which the die contacts the circular support substrate 1 in the chord area is 0.20 mm. Because the die can make surface contact with the circular support substrate 1 over the narrowest width of 0.20 mm, burrs that could otherwise generate as the resin oozes out of the die can be prevented.

It should be noted that bonding the semiconductor chip 4 onto the chamfered face of the circular support substrate 1 causes the width over which the die contacts the circular support substrate 1 to become narrower than 0.20 mm, in which case the resin oozes out of the die and burrs tend to generate.

(Third step in which the resin covering the pads of the semiconductor chip is removed)

In the aforementioned second step, the top face of the semiconductor chip 4 is covered with the sealing resin part 7; accordingly, the resin covering the pads 8 which will be used to input/output signals to/from the semiconductor chip 4 is removed by means of laser abrasion, to expose the pads 8 (FIG. 7).

Normally, resins that are used to seal semiconductor chips 4 are colored black in order to prevent malfunctioning caused by light; as a circular semiconductor chip 4 is sealed with such black sealing resin part 7, however, the positions of the pads 8 can no longer be identified by looking at them. If the three chords of the circular support substrate 1 used under the present invention are associated beforehand with the positions of the pads 8 on the semiconductor chip 4, the positions of the pads 8 can be obtained using the positions of the chords. Also, the circular support substrate 1 used here is such that the angles formed by the three perpendicular lines drawn from the center axis to the chords are 90 degrees, 120 degrees and 150 degrees, respectively, and since this allows for highly accurate positioning in the X direction, Y direction, and inclination (θ) using these three chords, any positional deviation that could occur in the manufacturing process is very small.

(Fourth step in which a rewiring layer is formed)

A rewiring layer 3 having conductive parts 9 for connecting the pads 8 and the external electrodes 2 is formed. For the formation of the rewiring layer 3, any known process normally used for this purpose can be utilized. For example, the following process can be used.

A copper layer 11 is formed on the sealing resin part 7 and pads 8 by means of electroplating (FIG. 8). Since the sealing resin part 7 is non-conductive, electroplating is performed after a Cu seed layer is formed thinly by means of sputtering. It should be noted that, since the circular support substrate 1 is formed from 42 alloy, applying electroplating directly on it causes copper plating to be formed also on the face of the circular support substrate 1 to which the semiconductor chip is not bonded. Since the face of the circular support substrate 1 to which the semiconductor chip is not bonded will become the outermost face of the semiconductor package, it is not desirable in terms of exterior quality that a copper layer is formed that will turn greenish blue when rusted. Accordingly, preferably the face of the circular support substrate 1 to which the semiconductor chip is not bonded is protected with masking tape, etc., beforehand.

After the copper layer 11 has been formed, a resist layer 12 is formed (FIG. 9), resist patterns are formed by lithography (FIG. 10), and then conductive parts 9 are formed by etching the copper layer 11 with the resist patterns serving as masks (FIG. 11). Additionally, a solder resist 14 is applied using an inkjet printer, except over via holes 13 where solder balls will be placed, after which the solder resist 14 is cured to form a rewiring layer 3 constituted by the sealing resin part 7 that seals the top face of the semiconductor chip, the conductive parts 9, and the solder resist 14 (FIG. 12).

(Fifth step in which bumps are formed)

A ball mounter is used to mount solder balls 15 on the via holes 13 (FIG. 13). The solder balls are heated with a reflow system and thus melted, to form bumps that serve as external electrodes 2, while at the same time the external electrodes 2 and the pads 8 are electrically connected via the conductive parts 9 (FIG. 14).

It should be noted that, in addition to the aforementioned first through fifth steps, desmearing, after-curing, marking of the circular support substrate positioned at the outermost face of the semiconductor package, or the like, can be applied as deemed appropriate.

Next, a cross sectional view of a semiconductor package that has been manufactured based on a manufacturing method comprising a step to separate a circular support substrate according to the present invention, is shown in FIG. 15. Those parts identical to the corresponding parts in the embodiment shown in FIGS. 4 to 14 are denoted by the same symbols. This semiconductor package has external electrodes 2, a rewiring layer 3, and a semiconductor chip 4, which are stacked in this order, and the adhesive 5 that is used to bond the semiconductor chip 4 and the circular support substrate 1 in the manufacturing process is incorporated into the rewiring layer 3. The face on the opposite side of the rewiring layer 3, and side faces, of the semiconductor chip 4, are sealed with the sealing resin part 7. The pads 8 on the semiconductor chip 4 are not covered with the adhesive 5, and the pads 8 are electrically connected to the external electrodes 2 via the conductive parts 9 of the rewiring layer 3.

This semiconductor package can be manufactured according to the manufacturing method below.

First step in which a semiconductor chip is bonded onto a non-chamfered face of the circular support substrate, in such a way that the pads face down.

Second step in which the semiconductor chip is sealed with resin.

Third step in which the circular support substrate is separated and turned upside down so that the pads face up.

Fourth step in which a rewiring layer is formed.

Fifth step in which bumps are formed.

Since the second step, fourth step and fifth step are the same as those in the aforementioned embodiment, the first step and third step are explained.

(First Step in which a Semiconductor Chip is Bonded onto a Non-Chamfered Face of the Circular Support Substrate, in Such a Way that the Pads Face Down)

Onto a circular support substrate 1, a circular semiconductor chip 4 is bonded using adhesive 5, with the pads 8 facing down, and also in a manner concentric with the circular support substrate 1 (FIG. 16). Use an insulating type for this adhesive 5, because it will be incorporated into the rewiring layer 3 later.

(Third Step in which the Circular Support Substrate is Separated and Turned Upside Down so that the Pads Face Up)

After the sealing resin part 7 has been formed in the second step (FIG. 17), the circular support substrate 1 is separated and turned upside down so that the pads 8 face up (FIG. 18).

In this manufacturing example, the adhesive 5 is used as a rewiring insulating layer, so the adhesive 5 covering the pads is removed by means of laser abrasion. It should be noted that the adhesive layer 5 can also be separated together with the circular support substrate 1. If the adhesive layer 5 is separated together with the circular support substrate 1, all that remains is to form inter-layer insulation film patterns on the semiconductor chip 4 in the fourth step in which a rewiring layer is formed, and then form conductive parts 9, apply and cure a solder resist 14, and form a rewiring layer 3.

It should be noted that, in addition to the aforementioned first through fifth steps, desmearing, after-curing, marking of the circular support substrate positioned at the outermost face of the semiconductor package, or the like, can be applied as deemed appropriate.

What is claimed is:

1. A circular support substrate for supporting a wafer thereon during a semiconductor package fabrication process, which is not a part of the wafer and has a principal face to which the wafer is bonded during the semiconductor package fabrication process, said circular support substrate having at least three chord sections along a circumference,
wherein the chord sections are provided at positions where a peripheral shape of the circular support substrate defined by the chord sections along the circumference are not linearly symmetrical to any straight line that lies on a plane of the circular support substrate and passes through a center axis of the circular support substrate, and
the principal face is not chamfered and a face opposite to the principal face is chamfered.

2. A circular support substrate according to claim 1, characterized in that an angle formed by both ends of each of the chord sections and the center axis of the circular support substrate is 12 to 36 degrees.

3. A circular support substrate according to claim 2, characterized in that an angle formed by two of respective lines, perpendicular to the at least three chord sections, drawn from the center axis of the circular support substrate, is 90 degrees or 180 degrees.

4. A circular support substrate according to claim 2, characterized in that the circular support substrate has three chord sections, and angles formed by three lines, perpendicular to the three chord sections, drawn from the center axis of the circular support substrate to the three chord sections are 90 degrees, 120 degrees, and 150 degrees, respectively.

5. A circular support substrate according to claim 2, characterized in that the circular support substrate is made of 42 alloy, Invar alloy, or Kovar alloy.

6. A circular support substrate according to claim 2, characterized in that physical properties are different on a one face and another face.

7. A circular support substrate according to claim 1, characterized in that an angle formed by two of respective lines, perpendicular to the at least three chord sections, drawn from the center axis of the circular support substrate, is 90 degrees or 180 degrees.

8. A circular support substrate according to claim 1, characterized in that the circular support substrate has three chord sections, and angles formed by three lines, perpendicular to the three chord sections, drawn from the center axis of the circular support substrate to the three chord sections are 90 degrees, 120 degrees, and 150 degrees, respectively.

9. A circular support substrate according to claim 1, characterized in that the circular support substrate is made of 42 alloy, Invar alloy, or Kovar alloy.

10. A circular support substrate according to claim 1, characterized in that physical properties are different on a one face and another face.

11. A semiconductor package characterized by comprising at least:
a circular support substrate according to claim 1;
a semiconductor chip bonded to the circular support substrate;
a sealing resin part that seals the semiconductor chip; and
external electrodes that are electrically connected, via conductive parts, to pads on the semiconductor chip.

12. A semiconductor package according to claim 11, characterized in that the external electrodes are bumps.

13. A method for manufacturing a semiconductor package, characterized by comprising a step to bond a wafer to a circular support substrate according to claim 1.

14. A method for manufacturing a semiconductor package, characterized by comprising at least following steps in this order:
a first step in which a semiconductor chip is bonded onto a circular support substrate according to claim 1, in such a way that the pads face up;
a second step in which the semiconductor chip is sealed with resin;
a third step in which the resin covering the pads of the semiconductor chip is removed;
a fourth step in which a rewiring layer is formed; and
a fifth step in which bumps are formed.

15. A method for manufacturing a semiconductor package, characterized by comprising at least following steps in this order:
a first step in which a semiconductor chip is bonded onto a circular support substrate according to claim 1, in such a way that the pads face down;
a second step in which the semiconductor chip is sealed with resin;
a third step in which the circular support substrate is separated and turned upside down so that the pads face up;
a fourth step in which a rewiring layer is formed; and
a fifth step in which bumps are formed.

16. A semiconductor package characterized by comprising at least:
a circular support substrate according to claim 2;
a semiconductor chip bonded to the circular support substrate;
a sealing resin part that seals the semiconductor chip; and
external electrodes that are electrically connected, via conductive parts, to pads on the semiconductor chip.

17. A method for manufacturing a semiconductor package, characterized by comprising a step to bond a wafer to a circular support substrate according to claim 2.

18. A method for manufacturing a semiconductor package, characterized by comprising at least following steps in this order:
a first step in which a semiconductor chip is bonded onto a circular support substrate according to claim 2, in such a way that the pads face up;
a second step in which the semiconductor chip is sealed with resin;
a third step in which the resin covering the pads of the semiconductor chip is removed;
a fourth step in which a rewiring layer is formed; and
a fifth step in which bumps are formed.

* * * * *